(12) United States Patent
Weber

(10) Patent No.: US 7,482,733 B2
(45) Date of Patent: Jan. 27, 2009

(54) PIEZOACTUATOR

(75) Inventor: Lutz Weber, Zweibrücken (DE)

(73) Assignee: thinXXS Microtechnology AG, Zweibrücken (DE)

( * ) Notice: Subject to any disclaimer, the term of this patent is extended or adjusted under 35 U.S.C. 154(b) by 24 days.

(21) Appl. No.: 10/570,414

(22) PCT Filed: Sep. 2, 2004

(86) PCT No.: PCT/EP2004/009780

§ 371 (c)(1),
(2), (4) Date: Sep. 18, 2006

(87) PCT Pub. No.: WO2005/024967

PCT Pub. Date: Mar. 17, 2005

(65) Prior Publication Data

US 2007/0007859 A1    Jan. 11, 2007

(30) Foreign Application Priority Data

Sep. 4, 2003   (DE) ............................ 203 13 727 U

(51) Int. Cl.
*H01L 41/04*    (2006.01)

(52) U.S. Cl. ............................ 310/324; 347/68; 347/71; 347/72

(58) Field of Classification Search ................. 310/324; 347/68–72
See application file for complete search history.

(56) References Cited

U.S. PATENT DOCUMENTS 5,870,118 A * 2/1999 Gunther et al. ............... 347/68
6,297,578 B1 * 10/2001 Takeuchi et al. ............ 310/330
6,609,785 B2 * 8/2003 Hashizume et al. ........... 347/70

\* cited by examiner

*Primary Examiner*—Jaydi A San Martin
(74) *Attorney, Agent, or Firm*—Friedrich Kueffner

(57) ABSTRACT

The invention relates to a piezoactuator for miniaturized pumps, atomizers, valves or the like. The piezoactuator comprises a piezoceramic disk (1) and a pressure disk (2) coupled to the piezoceramic disk. Said pressure disk is linked on its rim (18) with a substrate (3) in a fluid-tight manner and can be deflected by the piezoceramic disk (1) while modifying the volume of a cavity (4) formed between the pressure disk (2) and the substrate (3). According to the invention, a weak point (6, 9) is provided which extends along the linked rim (18) of the pressure disk (2) and forms a joint when the pressure disk is deflected.

8 Claims, 2 Drawing Sheets

PIEZOACTUATOR

The invention pertains to a piezo actuator for miniaturized pumps, atomizers, valves, etc., with a piezoelectric disk and a support disk connected to the piezoelectric disk, the support disk being connected around its edge to a substrate in a fluid-tight manner, where the support disk can be deflected by the piezoelectric disk to change the volume of a cavity formed between the support disk and the substrate.

Depending on the dimensions of the substrate, e.g., of a relation-symmetric pump body with a diameter of 5-25 mm and a thickness of 0.3-2 mm, the deflection of the support disk can lead to a concomitant deformation of the substrate, which prevents the desired change in the volume of the cavity. The actuator then fails to operate as efficiently as it can. Manufacturing tolerances and variations in material properties also exert a considerable effect on efficiency. To guarantee consistent performance, narrow tolerances must therefore be maintained. The production process itself is also subject to similar variations.

The present invention is based on the task of creating a new piezo actuator of the type described above, which can be manufactured with greater reliability and with less effort than the actuators according to the state of the art.

The inventive piezo actuator which accomplishes this task is characterized by a weak point, which extends around the connecting edge of the support disk and which acts as a joint when the support disk is deflected.

The weak point, i.e., the joint, advantageously prevents the substrate from moving along with the disk when the disk is deflected. The actuator thus achieves its full efficiency regardless of manufacturing tolerances and variations in material properties.

The weak point is preferably formed by at least one ring-shaped groove and/or by a ring-shaped, stepped recess extending around the edge of the support disk. A support disk modified in this way can be advantageously produced as a one-piece plastic part by injection-molding.

In particular, the ring-shaped groove or stepped recess is provided in the part of the support disk which projects beyond the piezoelectric disk. The ring-shaped groove or stepped recess can be formed on the side of the support disk which faces away from the substrate or on the side which faces it. It is also conceivable that grooves or stepped recesses could be provided on both sides of the support disk, in which case the grooves or recesses in question would be arranged opposite each other.

The ring-shaped groove preferably has a single base line at the lowermost point and is preferably designed with a U-shaped or V-shaped cross section. A cross-sectional form of this type precisely defines the position of the joint formed by the weak point, namely, by the base line. Variations in the dimensions of the components and in the properties of the materials then have only a slight effect on the deflection behavior.

In the preferred embodiment of the invention, the base line, in a view of the piezoelectric disk from above, extends between the edge of the piezoelectric disk and the inside edge of the ring-shaped edge area where the support disk is connected, preferably bonded or welded, to the substrate.

The remaining thickness of the material at the weak point is preferably in the range of 10-30% of the thickness of the support disk.

In another advantageous embodiment of the invention, the support disk has a recess, possibly leading from the ring-shaped groove and/or the stepped recess, through which a lead can be introduced to establish electrical contact with the electrode on the side of the piezoelectric disk facing the support disk.

In a further elaboration of the invention, the electrode on the side of the piezoelectric disk facing away from the support disk can be provided with a cut-away area at one edge. A contact layer electrically connected to the opposite electrode can then extend into this cut-away area. In this case the advantage is obtained that both of the electrodes of the piezoelectric disk can be contacted electrically on the same side, namely, on the side facing away from the support disk.

The invention is to be explained in greater detail below on the basis of exemplary embodiments and the attached drawings, which illustrate these exemplary embodiments:

Figure 1:
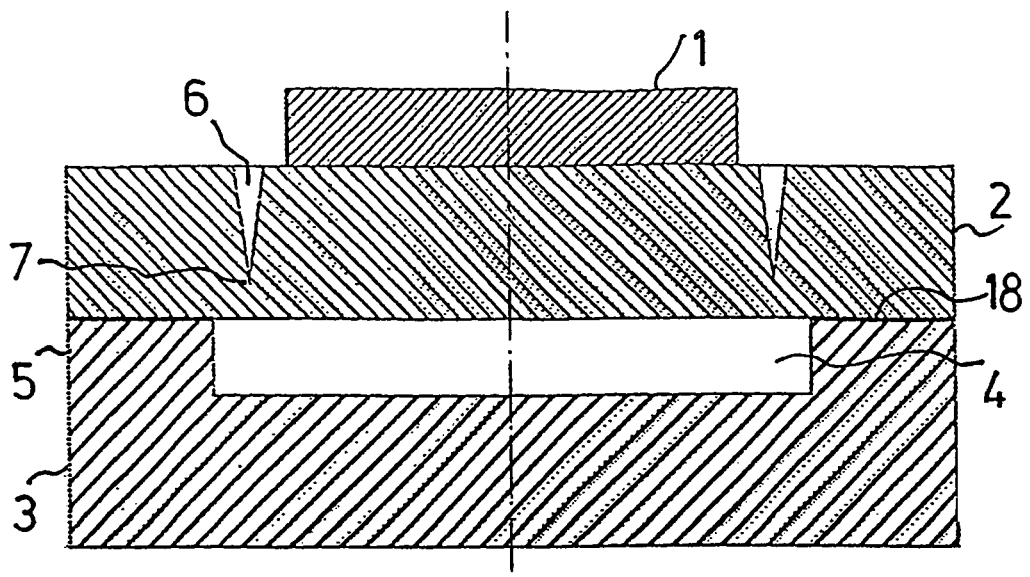
FIG. 1 shows the essential parts of a micropump with an actuator according to a first exemplary embodiment of the present invention.

A micropump shown in FIG. 1 has a ceramic piezoelectric disk 1; a support disk 2, which is connected to the piezoelectric disk and projects beyond the edge of the piezoelectric disk; and a pump body 3, connected to the support disk. The pump body has the same diameter as the support disk. A pump cavity 4 is formed between the support disk and the pump body. The parts just mentioned are rotationally symmetric, but they can be designed in some other way if desired.

The details of the micropump such as its valves, channels, and the electrodes of the piezoelectric disk are not shown in FIG. 1.

In the exemplary embodiment shown, the piezoelectric disk is made of ceramic material. The support disk and the pump body are each one-piece plastic parts made by injection-molding, the diameters of which are approximately 10 mm in the present example. The support disk is approximately 0.7 mm thick.

The entire surface of the piezoelectric disk on the side facing the support disk is bonded to the support disk 2, for which purpose an electrically conductive adhesive can be used, which thus also forms an electrode of the piezoelectric disk. The adhesive layer could also project from the joint to form a contact terminal. A bonded joint is also present between the ring-shaped edge area 18 of the support disk and the ring-shaped projection 5 of the pump body, the height of which is equal to the depth of the pump cavity.

A ring-shaped groove 6 is formed in the support disk. When the micropump is looked at from above, this groove is seen to be located between the piezoelectric disk 1 and the inside edge of the ring-shaped projection 5 or edge area 18. The cross section of this groove has the shape of a V, and its base line 7 at the lowermost point is approximately half way between the edge of the piezoelectric disk and the previously mentioned inside edge.

When no voltage is being applied to the piezoelectric disk 1, it has the flat shape shown in FIG. 1. When a positive voltage is applied, the disk contracts, as a result of which both it and the support disk 2 become curved in the manner of a bimetal element. The support disk, which is attached all the way around to the pump body 3, bulges downward into the pump cavity 4 and thus decreases its volume. The periodic application of voltage to the piezoelectric disk thus produces a pumping action.

The ring-shaped groove 6 weakens the support disk along the bonded edge area 18 in such a way that a joint is formed, which prevents the deflection of the support disk from being transferred to its edge area and across the bonded joint to the pump body. The location of this joint is determined precisely by the base line 7. If the pump body 3 were to be deflected as well, the change in the volume of the pump cavity 4 caused by the downward-bulging of the support disk 2 would be partially cancelled out, and the desired pumping efficiency would not be achieved.

Figure 2:
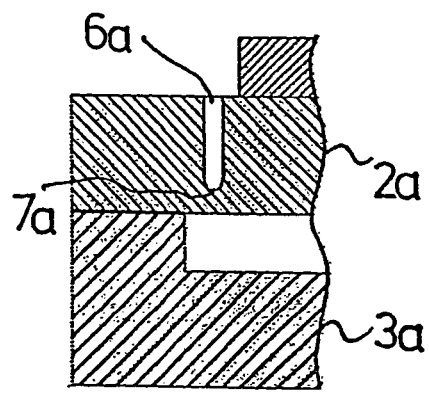
FIGS. 2-4 show partial views of a micropump with actuators according to additional exemplary embodiments of the present invention.

In the exemplary embodiment according to FIG. 2, a ring-shaped groove 6a is formed in a support disk 2a. The cross section of this groove is not V-shaped but rather U-shaped. In this case, too, the ring-shaped groove has a single lowermost base line 7a, which precisely defines the location of the joint formed by the ring-shaped groove 6a.

Figures 3, 4:
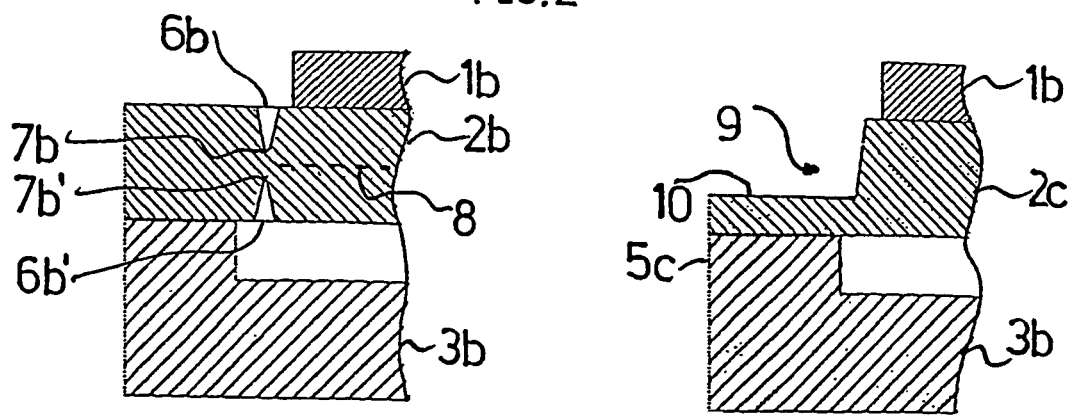

In the exemplary embodiment of FIG. 3, two ring-shaped grooves 6b and 6b' with V-shaped profiles are formed in a support disk 2b. When the pump is looked at from above, the base lines 7b and 7b' of these grooves are seen to be aligned with each other. The two ring-shaped grooves are of the same deth. Between the base lines there remains approximately 25% of the material thickness of the support disk. It is advantageous for a neutral bending line 8 to penetrate the remaining material of the support disk to minimize the tensile and compressive loads in this area.

In the exemplary embodiment of FIG. 4, a support disk 2c has a stepped recess 9 instead of a ring-shaped groove 6. The width of the ring-shaped shoulder 10 formed by the stepped recess 9 is somewhat larger than the width of the ring-shaped injection 5c bonded to the support disk 2c.

Figure 5:
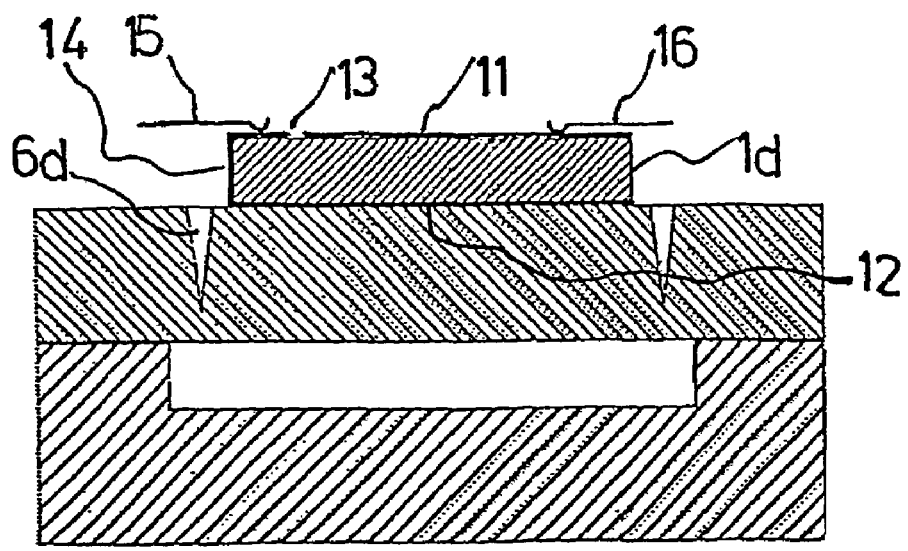
FIG. 5 shows a first exemplary embodiment of the electrical contacts of the piezoelectric disk of an actuator according to the invention.

The micropump shown in FIG. 5, which is largely the same as the micropump of FIG. 1, has a piezoelectric disk 1d with electrodes 11 and 12, which are formed by layers of metal deposited on the piezoelectric ceramic. Whereas the electrode 12 covers the entire surfaces of the piezoelectric disk facing the support disk, a cut-away area 13 is formed in the electrode 11 on the top surface of the piezoelectric disk. A contact layer 14, which is connected to the electrode 12 and which wraps around the edge of the piezoelectric disk, projects into this cut-away area. It is thus possible to attach the leads 15 and 16 to both of the electrodes 11 and 12 on the same side of the piezoelectric disk, namely, on the side facing away from the support disk, without any interference from the ring-shaped groove 6d.

Figure 6:
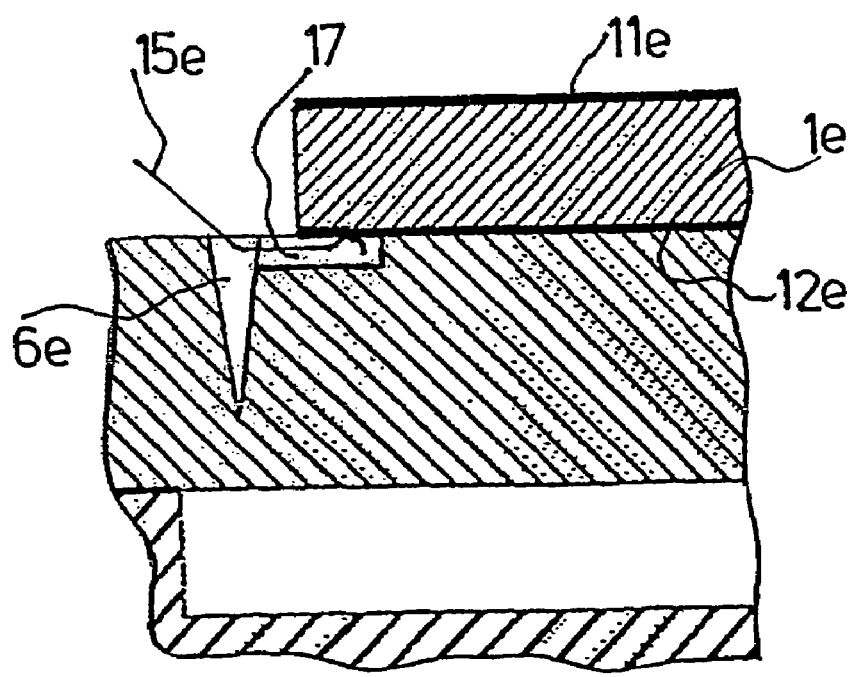
FIG. 6 shows a second exemplary embodiment of the electrical contacts of the piezoelectric disk of an actuator according to the invention.

In the exemplary embodiment according to FIG. 6, electrodes 11e and 12e are attached to a piezoelectric disk 1e. Each of these electrodes covers the entire surface of its assigned side of the disk. A recess 17 leading from a ring-shaped groove 6e makes it possible to connect a lead 16e to the electrode 12e.

The invention claimed is:

1. Piezo actuator for miniaturized pumps, atomizers, valves, with a piezoelectric disk (1) and a support disk (2) connected to the piezoelectric disk, the support disk being connected around its edge (18) to a substrate (3) in a fluid-tight manner, where the support disk can be deflected by the piezoelectric disk (1) to change the volume of a cavity (4) formed between the support disk (2) and the substrate (3), comprising a weak point (6, 9), which extends along the connecting edge (18) of the support disk (2) and which acts as a joint when the support disk is deflected, wherein the weak point (6, 9) is formed by at least one of the following, a ring-shaped groove (6) and a ring-shaped, stepped recess (9), and the ring-shaped groove (6) or the offset of the stepped recess (9) runs in a projection plane parallel to a plane of the piezoelectric disk and at a distance from the connecting edge (18) as well as from the piezoelectric disk (1).

2. Piezo actuator according to claim 1 wherein the ring-shaped groove (6) and/or the stepped recess (9) is formed on the side of the support disk (2) which faces the substrate or on the side which faces away from the substrate, or in that at least one of grooves (6b, 6b') and stepped recesses are provided on the both sides, opposite each other.

3. Piezo actuator according to claim 1 wherein the ring-shaped groove (6) has a single, lowermost base line (7) and a V-shaped or U-shaped cross section.

4. Piezo actuator according to claim 1, wherein the thickness of the material remaining at the weak point is equal to 10-30% of the thickness of the support disk (2).

5. Piezo actuator according to claim 1, wherein the support disk (2e) has a recess (17), leading from the at least one of the ring-shaped groove (6e) the stepped recess, for the introduction of a lead (15e) to the electrode (12e) of the piezoelectric disk (1e) on the side facing the support disk (2e).

6. Piezo actuator according to claim 1, wherein the electrode (11) has an cut-away edge area (13) on the side of the piezoelectric disk (1d) facing away from the support disk (2d), into which cut-away area a contact layer (14) connected to the other electrode (12) is introduced.

7. Piezo actuator according to claim 1, wherein the piezoelectric disk (1) is attached to the support disk (2) by a conductive adhesive, which also forms an electrode (12), where the adhesive layer can project from the joint to form a contact terminal.

8. Piezo actuator according to claim 1, wherein the support disk (2) is made as a one-piece plastic part by injection-molding.

* * * * *